(12) United States Patent
Li et al.

(10) Patent No.: US 10,001,876 B2
(45) Date of Patent: Jun. 19, 2018

(54) TOUCH DISPLAY PANEL, AND DRIVING METHOD AND DRIVING CIRCUIT FOR THE SAME

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Gujun Li, Shanghai (CN); Yue Li, Shanghai (CN); Xiaoye Li, Shanghai (CN); Dongxu Xiang, Shanghai (CN)

(73) Assignees: SHANGHAI TIANMA MICRO-ELECTRONICS CO., LTD., Shanghai, P.R. (CN); TIANMA MICRO-ELECTRONICS CO., LTD., Shenzhen, P.R. (CN)

( * ) Notice: Subject to any disclaimer, the term of this patent is extended or adjusted under 35 U.S.C. 154(b) by 0 days. days.

(21) Appl. No.: 15/676,671

(22) Filed: Aug. 14, 2017

(65) Prior Publication Data

US 2017/0344180 A1 Nov. 30, 2017

Related U.S. Application Data

(63) Continuation-in-part of application No. 14/881,953, filed on Oct. 13, 2015, now Pat. No. 9,766,744.

(30) Foreign Application Priority Data

Apr. 1, 2015 (CN) .......................... 2015 1 0152831

(51) Int. Cl.
*G06F 3/00* (2006.01)
*G06F 3/041* (2006.01)
(Continued)

(52) U.S. Cl.
CPC ............ *G06F 3/0416* (2013.01); *G06F 3/044* (2013.01); *G06F 3/0412* (2013.01); *H01L 25/18* (2013.01);
(Continued)

(58) Field of Classification Search
CPC ...... G06F 3/0416; G06F 3/0412; G06F 3/044; H01L 25/18; H01L 27/323
See application file for complete search history.

(56) References Cited

U.S. PATENT DOCUMENTS

2011/0109532 A1* 5/2011 Choi ................... H01L 27/3269
345/76
2015/0054752 A1* 2/2015 MacKey ................ G06F 3/044
345/173

(Continued)

*Primary Examiner* — Kevin M Nguyen
(74) *Attorney, Agent, or Firm* — Alston & Bird LLP

(57) ABSTRACT

An OLED touch display panel is provided, including: a display substrate; a touch electrode including multiple touch electrode units arranged on the display substrate; multiple touch switch elements having a one-to-one correspondence with and electrically connected to the touch electrode units respectively; multiple first signal lines each electrically connected to at least two touch switch elements located in different columns; multiple second signal lines each electrically connected to at least two touch switch elements located in different rows; a display pixel arranged on the touch electrode, where the display pixel includes multiple pixel unit groups each corresponding to one touch electrode unit; and a glass cover arranged on the display pixel, where each touch electrode unit has multiple meshes opposite to pixel units in one pixel unit group corresponding to the each touch electrode unit in a vertical direction, respectively.

16 Claims, 9 Drawing Sheets

(51) Int. Cl.
*G06F 3/044* (2006.01)
*H01L 27/32* (2006.01)
*H01L 25/18* (2006.01)
*H01L 27/12* (2006.01)

(52) U.S. Cl.
CPC .. *H01L 27/323* (2013.01); *G06F 2203/04112* (2013.01); *H01L 27/1255* (2013.01); *H01L 27/3244* (2013.01)

(56) References Cited

U.S. PATENT DOCUMENTS

2015/0179717 A1* 6/2015 Kawata ............... H01L 29/7869
257/43
2016/0132154 A1* 5/2016 Lee ..................... G06F 3/044
345/174

* cited by examiner

TOUCH DISPLAY PANEL, AND DRIVING METHOD AND DRIVING CIRCUIT FOR THE SAME

CROSS REFERENCE OF RELATED APPLICATION

The present application is a continuation-in-part of U.S. patent application Ser. No. 14/881,953, filed on Oct. 13, 2015, which claims the priority to Chinese Patent Application No. CN201510152831.5, entitled "TOUCH DISPLAY PANEL, AND DRIVING METHOD AND DRIVING CIRCUIT FOR THE SAME", filed on Apr. 1, 2015 with the State Intellectual Property Office of the Peoples Republic of China, which is incorporated herein by reference in its entirety.

BACKGROUND

With the development of display technology, more and more display panels are integrated with a touch function based on a mutual-capacitive touch technology or a self-capacitive touch technology. As compared with the mutual-capacitive touch technology, the self-capacitive touch technology is more applicable to light and thin display panels since only one layer of touch electrodes are needed.

Currently, in a self-capacitive touch display panel, a common electrode in the display panel is divided into multiple block-shaped electrodes and is driven in a time-division manner, and the common electrode further serves as touch electrodes, which further reduces thickness of the display panel, improves production efficiency and lowers production cost.

However, in the self-capacitive touch display panel, each block-shaped electrode needs to be connected to a driving circuit via a single electrode lead, to ensure the touch sensitivity of the display panel. In this case, there are multiple electrode leads in the display panel. Particularly, the larger the size of the display panel is, the more the electrode leads in the display panel are. For example, if the display panel includes block-shaped electrodes arranged in N rows and M columns, there are N*M electrode leads correspondingly; here, M and N are integers larger than 1. Taking a 5-inch display panel as an example, 448 leads are needed. Therefore, the development of the self-capacitive touch display panel is limited greatly.

BRIEF DESCRIPTION OF THE DRAWINGS

Drawings to be used in the description of embodiments or the conventional technology are described briefly as follows, so that technical solutions according to the embodiments of the present disclosure or according to the conventional technology may become clearer. It is obvious that the drawings in the following description only illustrate some embodiments of the present application. For those skilled in the art, other drawings may be obtained according to these drawings without any creative work.

DETAILED DESCRIPTION

The technical solutions according to embodiments of the present disclosure are described clearly and completely hereinafter in conjunction with the drawings. It is obvious that the described embodiments are only a few rather than all of the embodiments of the present application. Any other embodiments obtained by those skilled in the art based on the embodiments in the present disclosure without any creative work fall in the scope of the present disclosure.

As described in the background, there are lots of wires in the conventional self-capacitive touch display panel, which greatly restricts the development of the touch display panel.

In view of the above, a touch display panel is provided according to a first embodiment of the present disclosure.

Figure 1:
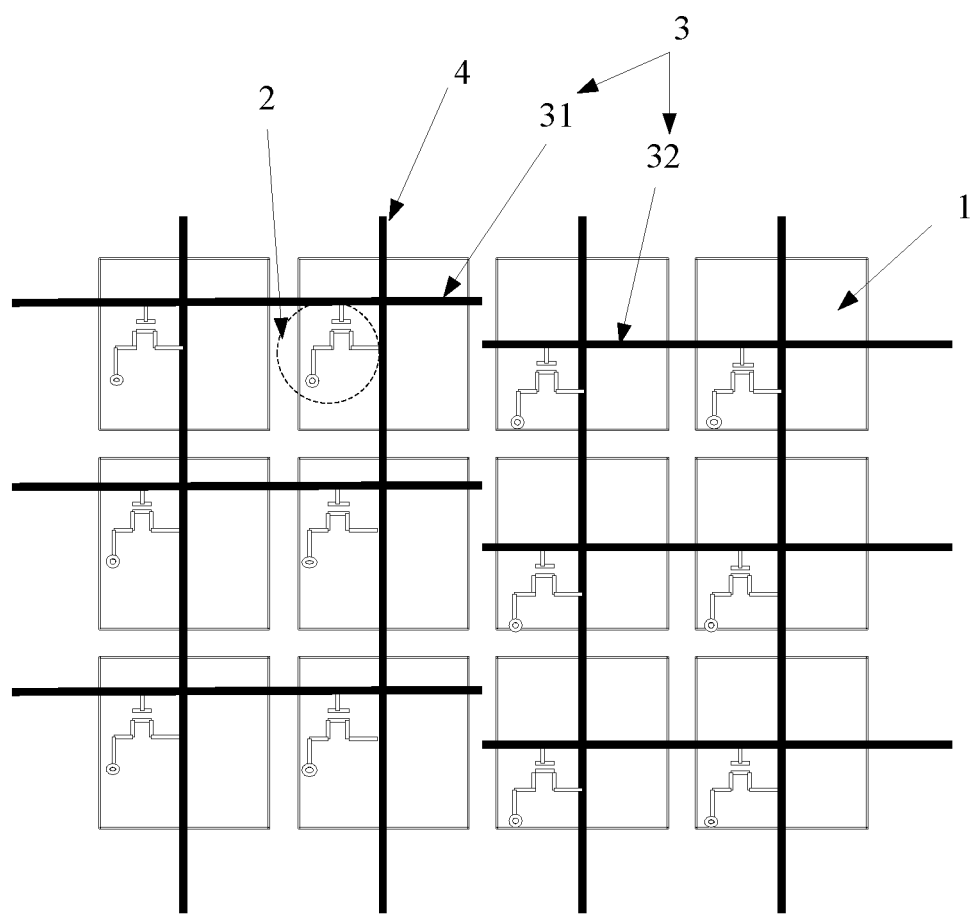
FIG. 1 is a schematic structural diagram of a touch display panel according to a first embodiment of the present disclosure.

As shown in FIG. 1, touch display panel includes:

a common electrode, which includes multiple common electrode units 1 disposed in rows and columns, where the common electrode unit 1 serve as the common electrode in a display phase and serves as touch electrodes in a touch phase;

multiple switch elements 2, wherein an one-to-one correspondence exists between the switch elements 2 and the common electrode units 1, and each switch element 2 is electrically connected to a common electrode unit 1 corresponding to the switch element 2;

multiple first signal lines 3, wherein each first signal line 3 is electrically connected to at least two switch elements 2 located in different columns to reduce the number of the first signal lines 3 and to avoid low touch sensitivity due to a touch blind zone occurring in the touch phase; and multiple second signal lines 4, wherein each second signal line 4 is electrically connected to at least two switch elements 2 located in different rows to reduce the number of the second signal lines 4 and to avoid low touch sensitivity due to a touch blind zone occurring in the touch phase;

where the first signal lines 3 are for turning on or turning off the switch elements 2, and the second signal lines 4 are for providing a driving signal to a common electrode unit 1 electrically connected to a turned-on switch element 2.

It should be noted that, in an implementation, in a display phase, driving signals are simultaneously provided to the switch elements 2 via the multiple first signal lines 3 to turn on the switch elements 2, and common voltage signals are simultaneously provided, via the multiple second signal lines 4, to the common electrode units 1 electrically connected to turned-on switch elements 2, to achieve a display function. In a touch phase, driving signals are provided via the respective first signal lines 3 row by row, to successively turn on the switch elements 2 electrically connected to the respective first signal lines 3, and touch signals are provided, via the second signal lines 4, to the common electrode units 1 electrically connected to turned-on switch elements 2, to achieve a touch detection.

Based on the above, in an implementation, the switch elements 2 are thin-film transistors. Each thin-film transistor includes a first electrode, a second electrode and a gate electrode. In an implementation, the first signal line 3 is electrically connected to the gate electrode of the thin-film transistor and the second signal line 4 is electrically connected to the second electrode of the thin-film transistor. It should be noted that, in an implementation, the first electrode is a source electrode and the second electrode is a drain electrode. In another implementation, the first electrode is a drain electrode and the second electrode is a source electrode, which is not limited herein and depends on actual cases.

Based on the above, in an implementation, the common electrode includes common electrode units 1 arranged in N rows and M columns. Here, M and N are integers larger than 1. In an implementation, each of the multiple first signal lines 3 includes a first sub-line 31 and a second sub-line 32. Gates electrodes of M thin-film transistors located in different columns are electrically connected with the first sub-line 31 and the second sub-line 32, as shown in FIG. 1. In a second the embodiment, each first signal line 3 is electrically connected to gate electrodes of M thin-film transistors located in different columns, as shown in FIG. 2, so that the number of the first signal lines 3 is reduced maximally, which is not limited herein and depends on actual cases.

Figure 2:
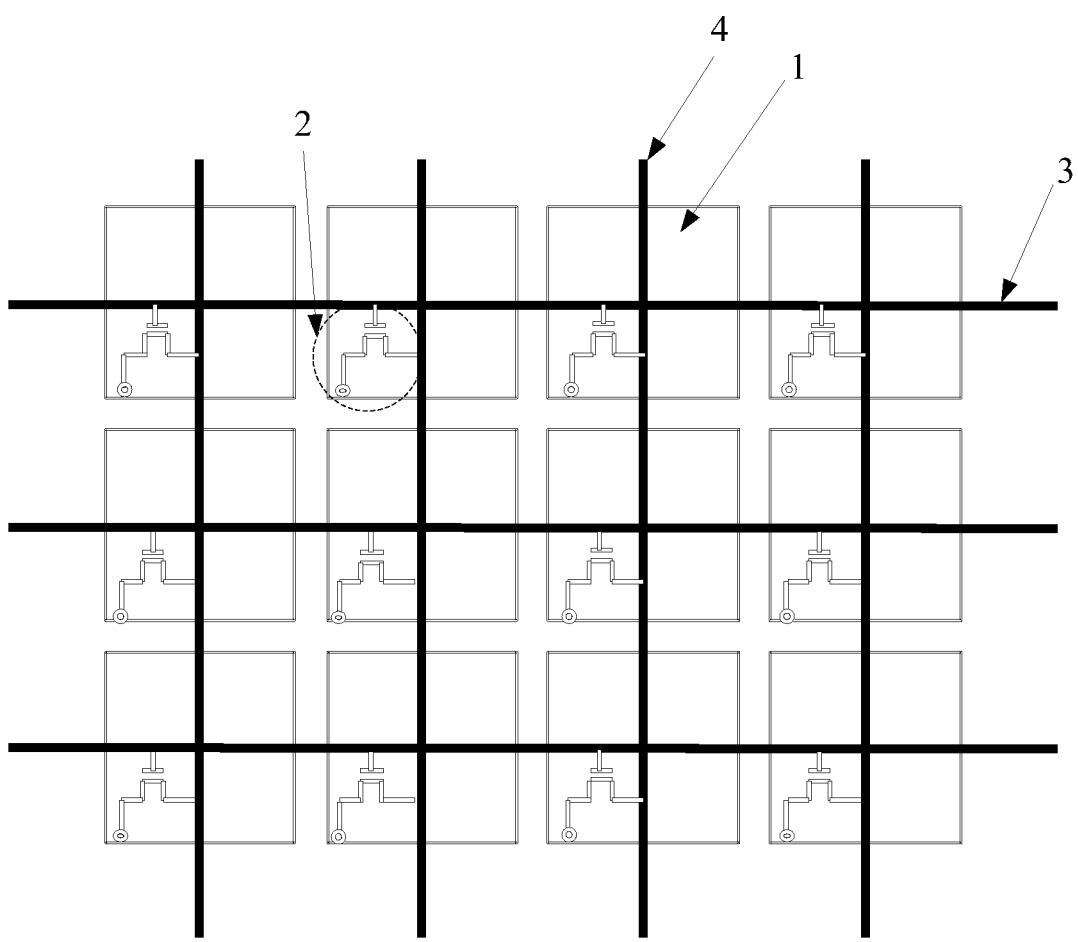
FIG. 2 is a schematic structural diagram of a touch display panel according to a second embodiment of the present disclosure.

In a case that each first signal line 3 is electrically connected to the gate electrodes of M thin-film transistors located in different columns, in an implementation as shown in FIG. 2, each first signal line 3 is electrically connected to gate electrodes of M thin-film transistors located in the same row, to reduce the length of each first signal line 3. In a third embodiment of the present disclosure, each first signal line 3 may be electrically connected to gate electrodes of M thin-film transistors which are not all located in the same row, as shown in FIG. 3, which is not limited herein and depends on actual cases.

Based on any one of the above embodiments, in an implementation, the common electrode includes common electrode units arranged in N rows and M columns, and each second signal line 4 is electrically connected to second electrodes of N thin-film transistors, to reduce the number of the second signal lines 4 maximally. Here, M and N are integers larger than 1.

Figure 3:
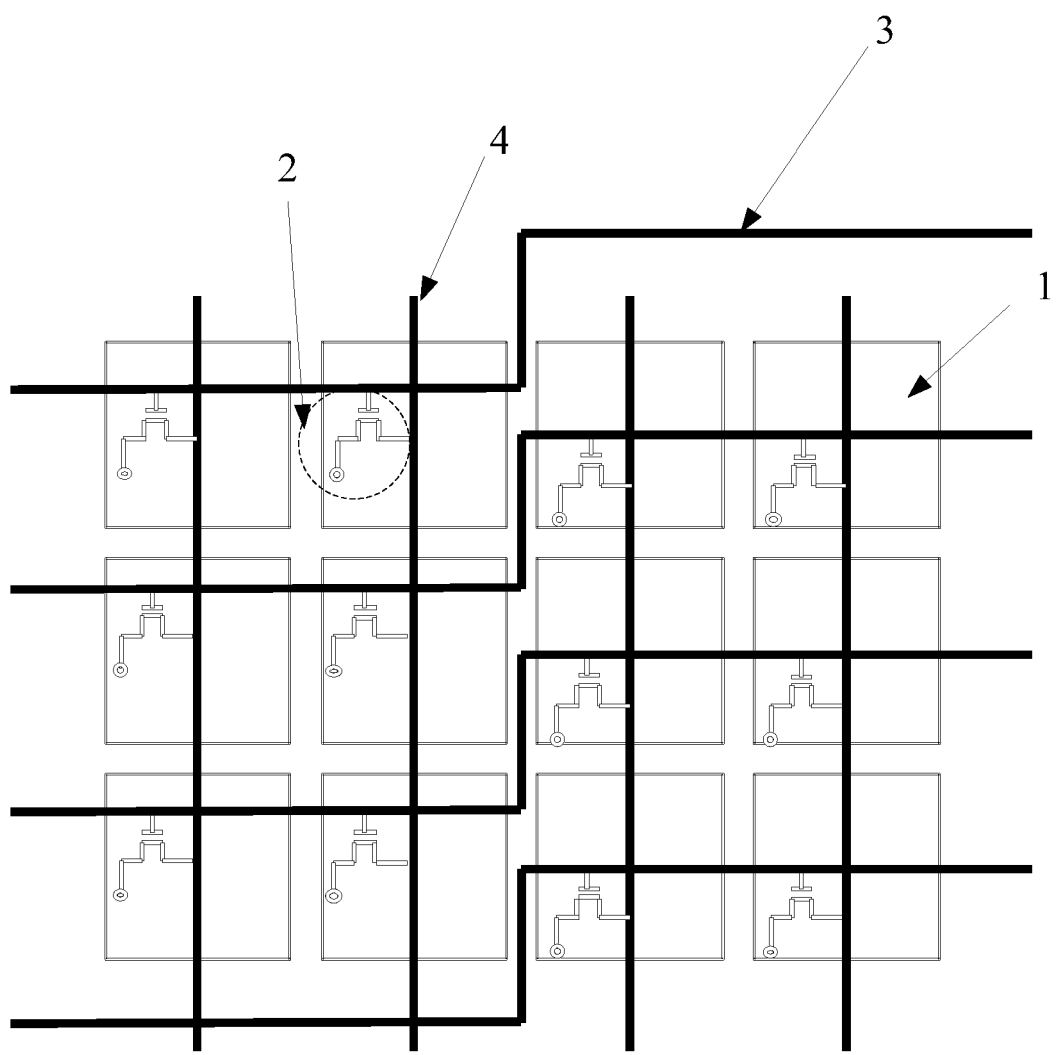
FIG. 3 is a schematic structural diagram of a touch display panel according to a third embodiment of the present disclosure.

Based on the above embodiments, in an implementation, each second signal line 4 is electrically connected to second electrodes of N thin-film transistors located in the same column, as shown in FIGS. 2 and 3, to reduce the length of each second signal line 4. In another implementation, the second signal line 4 may be electrically connected to second electrodes of N thin-film transistors which are not all located in the same column, which is not limited herein and depends on actual cases.

Taking a 5-inch touch display panel including 28 rows and 16 columns as an example, in a case that each first signal line is electrically connected to 16 thin-film transistors and each second signal line is electrically connected to 28 thin-film transistors, the total number of the first signal lines 3 and the second signal lines 4 in the touch display panel is 44. As compared with the conventional technologies in which each common electrode unit is electrically connected to a single lead (requiring a total of 448 leads), the number of leads in the embodiment is less than one tenth of the number of leads in the conventional technologies. Therefore, the number of leads in the touch display panel is reduced greatly.

It can be seen from the above that, in the touch display panel according to the embodiments of the present disclosure, each first signal line 3 is electrically connected to at least two switch elements 2 located in different columns and each second signal line 4 is electrically connected to at least two switch elements 2 located in different rows, rather than that each common electrode unit 1 corresponding to the switch element 2 is electrically connected to a single signal line. Hence, the number of leads in the touch display panel is reduced which is advantageous over conventional touch display technology.

Correspondingly, a driving method for a touch display panel is further provided according to an embodiment of the present disclosure. The driving method is applied in the touch display panel according to any one of the above embodiments.

The driving method may include:

providing driving signals to the multiple first signal lines 3 simultaneously to turn on the multiple switch elements and providing common voltage signals to the multiple second signal lines 4 simultaneously, in a display phase, to achieve a display function; and providing driving signals to the multiple first signal lines 3 row by row to successively turn on switch elements 2 electrically connected to the first signal lines 3, and providing touch signals to the multiple second signal lines 4 simultaneously, in a touch phase, to achieve a touch function.

It should be noted that, in an implementation, the providing the driving signals to the multiple first signal lines 3 row by row may include providing the driving signals to the multiple first signal lines 3 in turn from a top row of first signal line to a bottom row of first signal line, or in turn from a bottom row of first signal line to a top row of first signal line, or in other preset orders, which is not limited herein, as long as it is ensured that one driving signal is provided to only one first signal line 3 at any time instant during the touch phase.

No touch blind zone is formed and the touch sensitivity is not reduced since the switch elements 2 in the same row are turned on simultaneously and a case that at least two switch elements 2 in the same column are turned on simultaneously does not exist. Based on the above embodiments, in an implementation, as shown in FIG. 1, each first signal line 3 includes a first sub-line 31 and a second sub-line 32. In a case that all of the switch elements 2 electrically connected to the first sub-line 31 and the second sub-line 32 are located in different columns, it is preferred to provide driving signals to the first sub-line 31 and the second sub-line 32 simultaneously in the touch phase to shorten a scanning period in the touch phase.

Based on the above embodiments, in an implementation, if each first signal line 3 is electrically connected to the switch elements 2 in the same row, it is preferred to provide driving signals to the multiple first signal lines 3 row by row to turn on the switch elements 2 row by row in the touch phase. It should be noted that, in an embodiment of the present disclosure, the switch elements 2 in respective rows may be turned on from a top row to a bottom row, or from a bottom row to a top row, or in other preset orders, which is not limited herein and depends on actual cases.

In addition, a driving circuit for a touch display panel is provided according to a fourth embodiment of the present disclosure. The driving circuit is applied to the touch display panel according to any one of the above.

Figure 4:
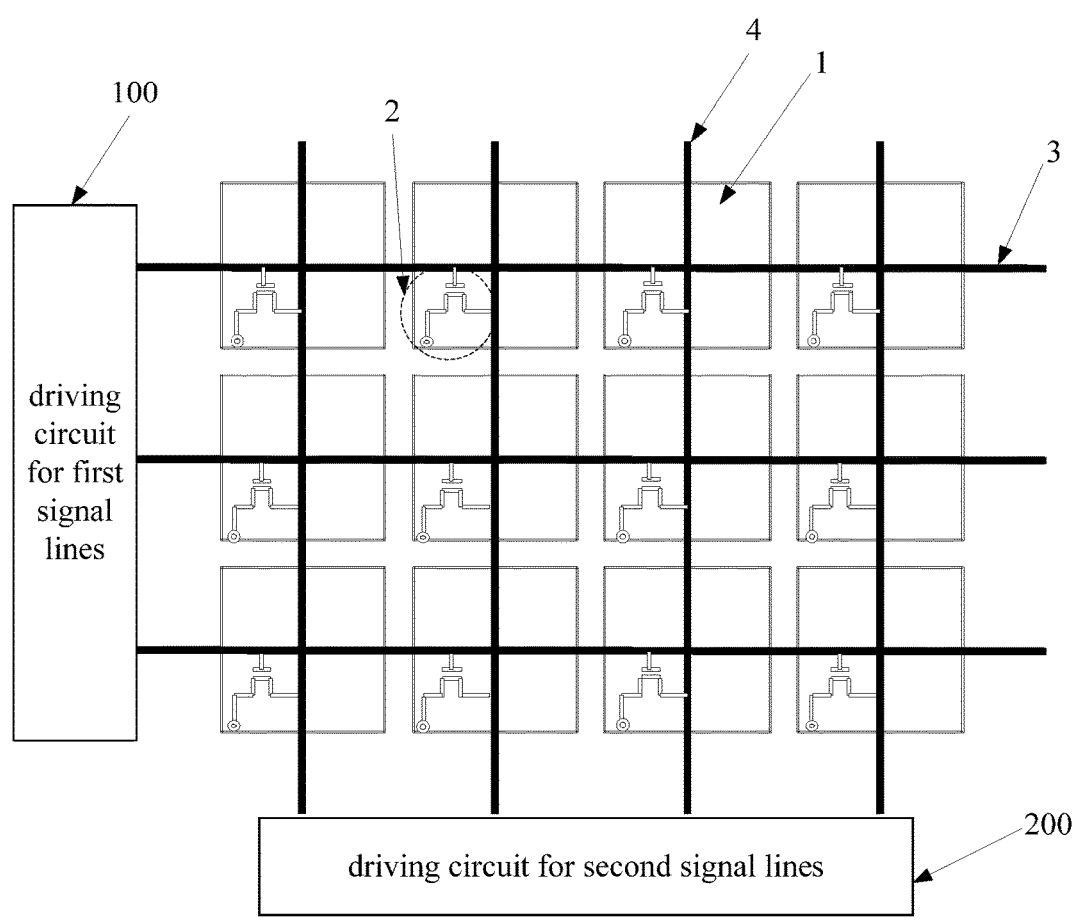
FIG. 4 is a schematic diagram showing electrical connection of a driving circuit for a touch display panel according to a fourth embodiment of the present disclosure.

As shown in FIG. 4, the driving circuit may include:

a driving circuit 100 for first signal lines, configured to simultaneously provide driving signals to the multiple first signal lines 3 to turn on the multiple switch elements 2 in a display phase, and to provide driving signals to the multiple first signal lines 3 row by row to turn on switch elements 2 electrically connected to the multiple first signal lines 3 row by row in a touch phase; and a driving circuit 200 for second signal lines, configured to provide common voltage signals to the multiple second signal lines 4 simultaneously in the display phase and to provide touch signals to the multiple second signal lines 4 simultaneously in the touch phase.

Figure 5:
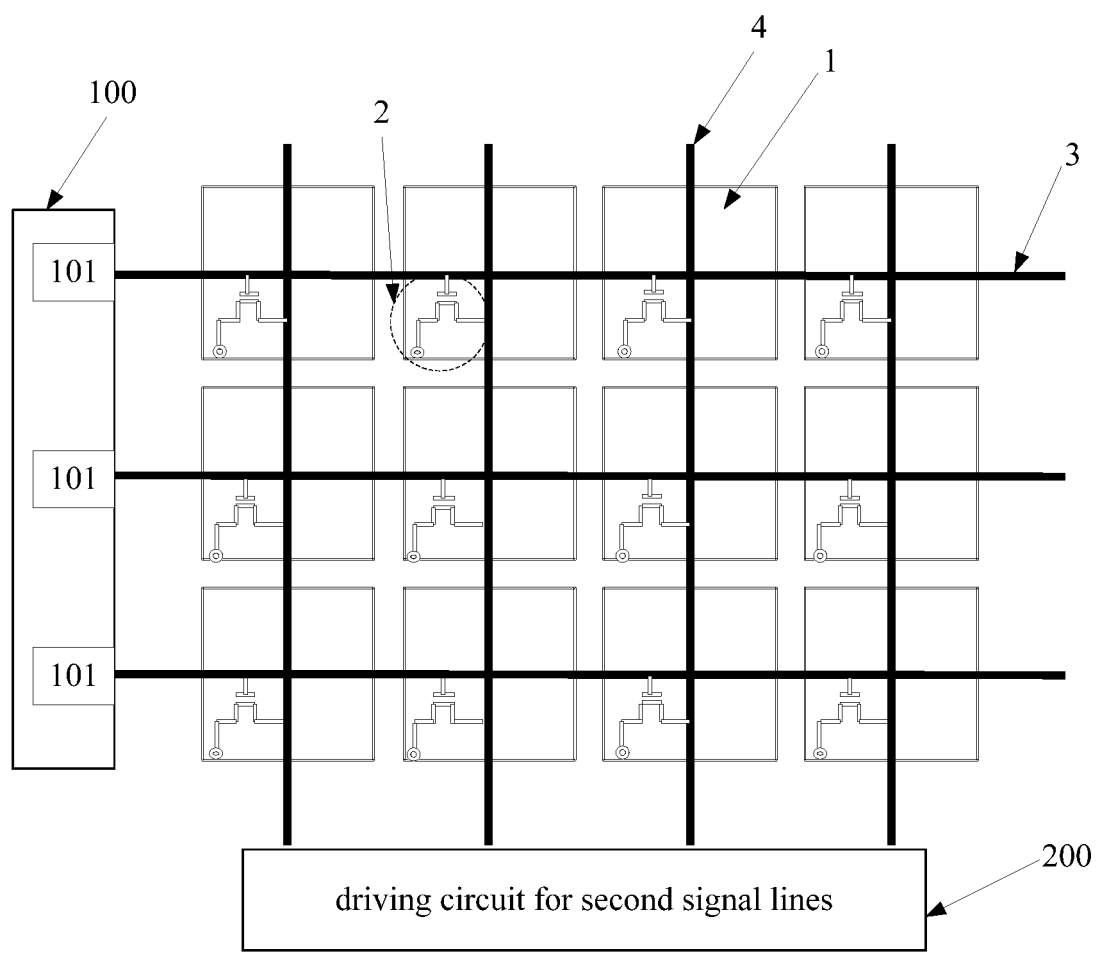
FIG. 5 is a schematic structural diagram of a first driving circuit of a driving circuit for a touch display panel according to a fifth embodiment of the present disclosure.

Based on the above embodiments, in a fifth embodiment of the present disclosure, as shown in FIG. 5, the driving circuit 100 for the first signal lines includes multiple first signal sources 101. A one-to-one correspondence exists between the first signal sources 101 and the first signal lines 3 and each first signal source provides a driving signal to the first signal line 3 electrically connected to the first signal source. It should be noted that, in an embodiment of the present disclosure, in the touch phase, the multiple first signal sources 101 successively provide the driving signals to the first signal lines 3 respectively electrically connected to the multiple first signal sources 101. That is, one and only one first signal source 101 provides a driving signal to the first signal line 3 electrically connected to the first signal source 101 at any time instant in the touch phase, which ensures that one and only one first signal line 3 provides a driving signal to a switch element 2 electrically connected to the first signal line 3 at any time instant in the touch phase, thereby avoiding a reduced touch sensitivity due to a touch blind zone.

Figure 6:
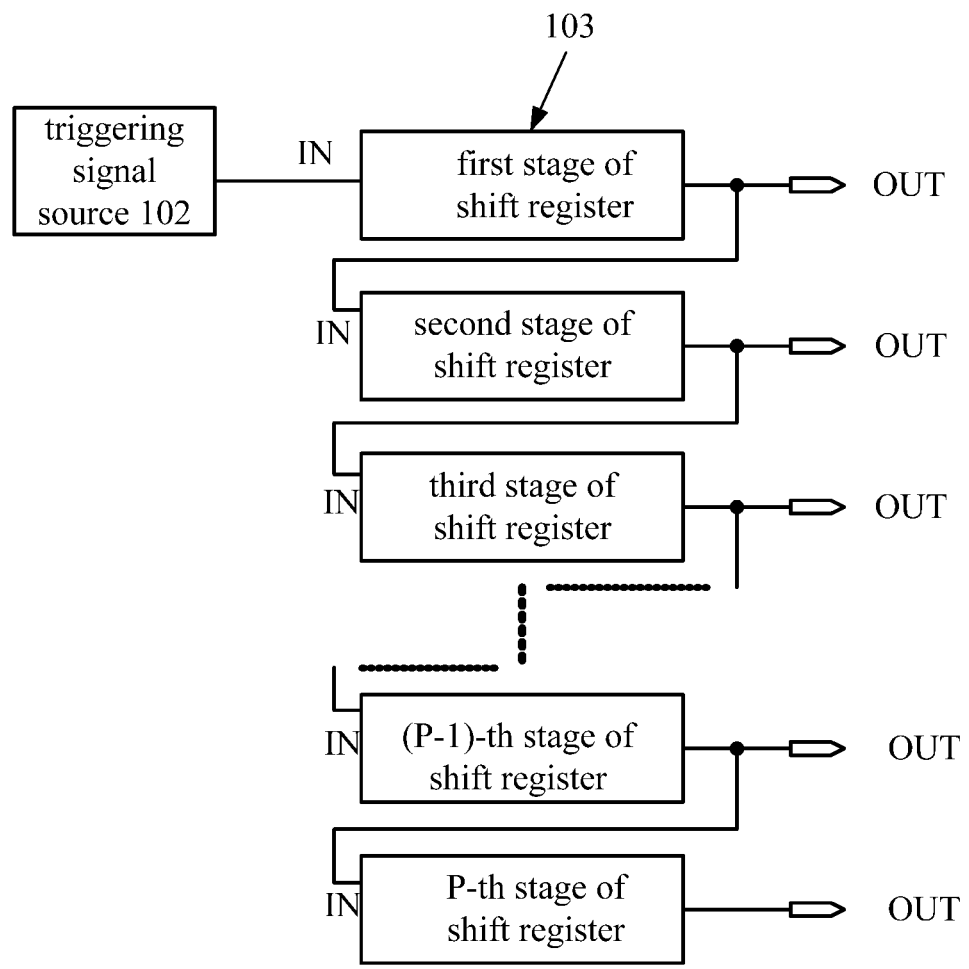
FIG. 6 is a schematic structural diagram of a first driving circuit of a driving circuit for a touch display panel according to a sixth embodiment of the present disclosure.

In a sixth embodiment of the present disclosure, as shown in FIG. 6, the driving circuit 100 for the first signal lines includes a triggering signal source 102, and a control circuit including multiple shift registers 103. The control circuit includes a first stage of shift register to a P-th stage of shift register, where P is the number of the first signal lines 3 in the touch display panel. An input terminal of the first stage of shift register is electrically connected to the triggering signal source 102, the first stage of shift register operates in response to a triggering signal from the triggering signal source 102 and provides a driving signal to a first signal line 3 electrically connected to the first stage of shift register. An output terminal of an I-th stage of shift register is electrically connected to an input terminal of an (I+1)-th stage of shift register to trigger the (I+1)-th stage of shift register to operate, and the I-th stage of shift register provides a driving signal to a first signal line 3 electrically connected to the I-th stage of shift register; where I is not less than 1 and is less than P. Since a certain time delay exists between a signal reception at the input terminal of one shift register and a signal output at the output terminal of the shift register, in an embodiment of the present disclosure, driving signals may be provided to the first signal lines 3 row by row by using a current shift register to trigger a next stage of shift register to operate, and the switch elements 2 electrically connected to the first signal lines 3 are turned on row by row. In another embodiment of the present disclosure, the driving signals may be provided to the first signal lines 3 row by row in other ways, to turn on the switch elements 2 electrically connected to the first signal lines 3 row by row, which are not limited herein and depend on actual cases.

In summary, in the touch display panel, and the driving method and driving circuit for the touch display panel according to the embodiments of the present disclosure, each first signal line 3 is electrically connected to at least two switch elements 2 located in different columns and each second signal line 4 is electrically connected to at least two switch elements 2 located in different rows, rather than that each common electrode unit 1 corresponding to one switch element 2 is electrically connected to a single signal line. Hence, the number of leads in the touch display panel is reduced and the problem of lots of leads in the touch display panel is alleviated.

The touch display panel according to the above embodiments may be implemented as an organic light emitting diode (OLED) touch display panel, and such implementation will be disclosed in details below.

Currently, there are mainly two types of OLED touch display panels according to integration of the touch element with the display panel. One type is on-cell OLED touch display panel in which the touch element is formed on the outside surface of the display panel, which has a large thickness with low integration degree. Another type is in-cell OLED touch display panel in which the touch element is formed on the inner surface of the display panel, which has a small thickness with high integration degree.

Figure 7:
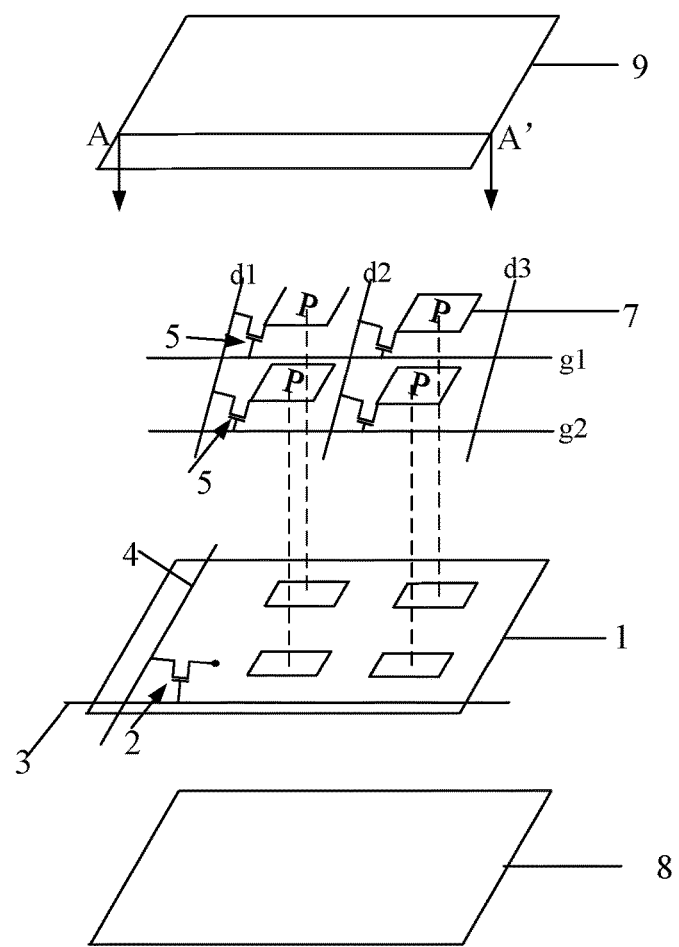
FIG. 7 is a perspective diagram of an OLED touch display panel according to a seventh embodiment of the present disclosure.
Figure 8:
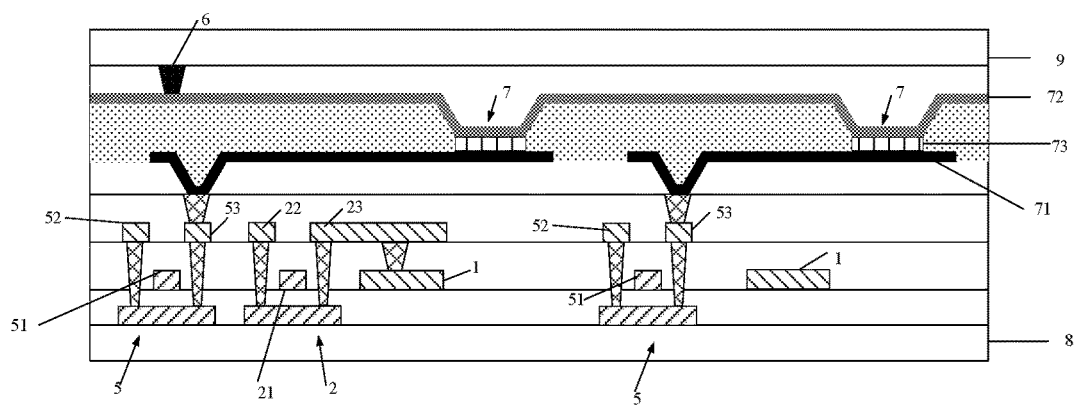
FIG. 8 is a section view of the OLED touch display panel shown in FIG. 7 along the line AA'.

FIG. 7 illustrates an OLED touch display panel of in-cell type according to a seventh embodiment of the disclosure. FIG. 8 illustrates a section view of the OLED touch display panel shown in FIG. 7 along the line AA'. The touch display panel according to the embodiment includes a touch electrode, and the touch electrode may have a same structure as the common electrode according to any of the above first to third embodiments.

As shown in FIG. 7, the OLED touch display panel includes a display substrate, a touch electrode, a display pixel and a glass cover.

The touch electrode is provided on the display substrate 8. The touch electrode includes an electrode unit 1, a touch TFT 2 electrically connected to the electrode unit 1, and a first signal line 3 and a second signal line 4 which are electrically connected to the touch TFT 2. FIG. 7 illustrates merely one electrode unit 1 and one touch TFT 2 of FIGS. 1-3. It should be noted that more electrode units 1 and touch TFTs 2 can be provided and arranged in a same way as shown in FIGS. 1-3.

The display pixel is arranged adjacent to the touch electrode. The display pixel includes pixel units 7 defined by data lines d1, d2, d3 and gate lines g1 and g1. Each pixel unit 7 corresponds and connects to a display TFT 5. FIG. 7 illustrates merely four pixel units and four display TFTs 5. It should be noted that more pixel units and more display TFTs may be provided to correspond to one electrode unit 1.

In order to avoided the light emitted by the pixel units 7 from being shielded by the electrode unit 1, the electrode unit 1 is formed to be a mesh structure, i.e., the electrode unit 1 includes multiple hollows that opposite to the pixel units in a vertical direction.

The glass cover 9 is formed above the display pixel.

As shown in FIG. 8, the electrode unit 1, the touch TFT 2 corresponding to the electrode unit 1 and the display TFTs 5 corresponding to the pixel units 7 are formed on the display substrate 8. Each display TFT 5 includes a gate electrode 51, a first electrode 52 and a second electrode 53. Each touch TFT 2 includes a gate electrode 21, a first electrode 22 and a second electrode 23.

In FIG. 8, the gate electrode 51, the gate electrode 21 and the electrode unit 1 are formed on a same layer, and the electrode unit 1 is electrically connected to the second electrode 23 of the touch TFT 2 through vias. It should be noted that the electrode unit 1 may be formed in a same layer as the first electrode 52, 22 or the second electrode 53, 23, or may be formed by using other layer, or may be formed in an individual layer, as long as the electrode unit 1 is electrically connected to the first electrode or second electrode of the touch TFT 2.

The gate electrode 21 of the touch TFT 2 may be electrically connected to the first signal line 3 (not shown). The first signal line 3 may be in a same layer as the gate electrode 21. Alternatively, the first signal line 3 may be in a different layer from the gate electrode 21, and in this case the first signal line 3 is electrically connected to the gate 21 through vias.

The first electrode 22 of the touch TFT 2 may be electrically connected to the second signal line 4 (not shown). The second signal line 4 may be in a same layer as the first electrode 22. Alternatively, the second signal line 4 may be in a different layer from the first electrode 22, and in this case the second signal line 4 is electrically connected to the first electrode 22 through vias.

The first electrode 22 of the touch TFT 2 may be a source electrode and the second electrode 23 of the touch TFT 2 may be a drain electrode. Alternatively, the first electrode 22 of the touch TFT 2 may be a drain electrode and the second electrode 23 of the touch TFT 2 may be a source electrode.

Pixel units 7 are formed above the display TFTs 5, the touch TFT 2 and the electrode unit 1. Each pixel unit 7 includes an anode 71, a cathode 72 and an organic light-emitting layer 73 between the anode 71 and the cathode 72. The anode 71 of the pixel unit 7 may be electrically connected to the first electrode 52 or the second electrode 53 of the display TFT 5 corresponding to the pixel unit 7. The pixel unit 7 opposites to the mesh of the electrode unit 1, to let the light from the pixel unit 7 pass through the electrode unit 1.

The glass cover 9 is arranged above the pixel unit 7 through a holder 6.

Figure 9:
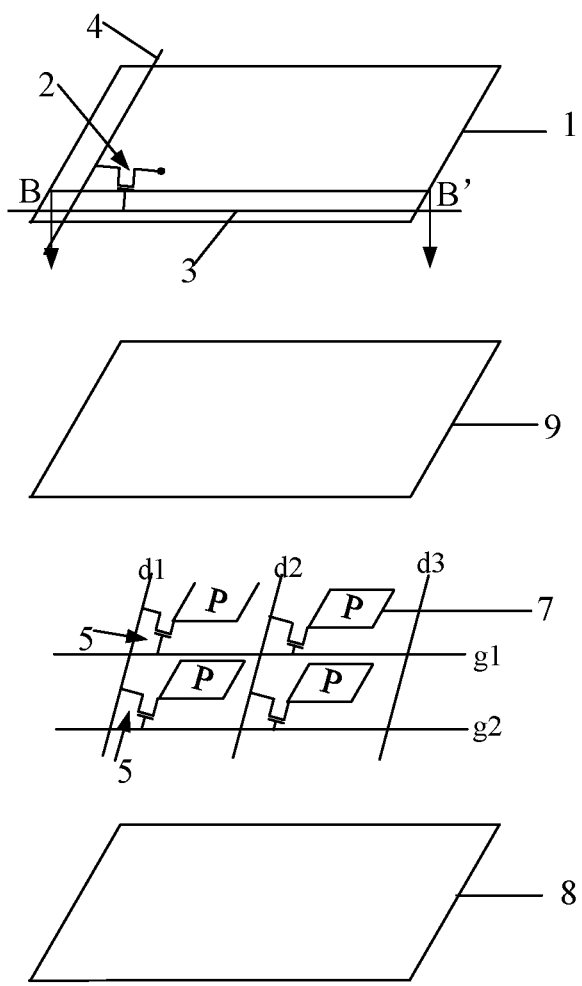
FIG. 9 is a perspective diagram of an OLED touch display panel according to an eighth embodiment of the present disclosure.
Figure 10:
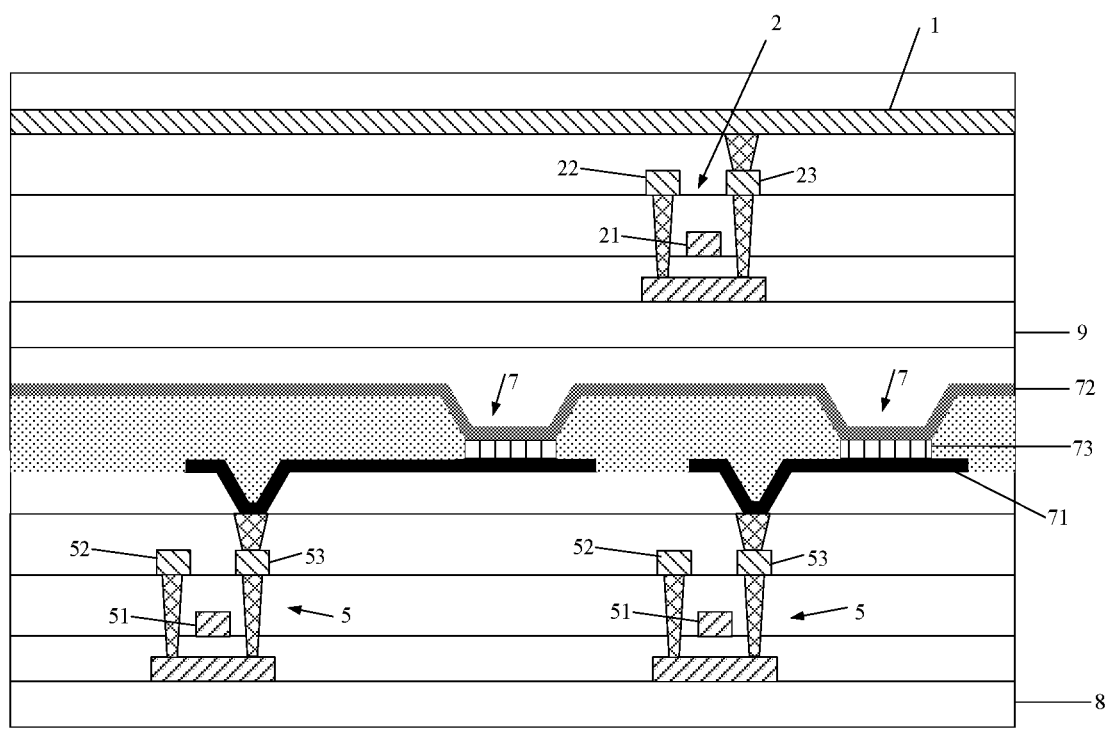
FIG. 10 is a section view of the OLED touch display panel shown in FIG. 9 along the line BB'.

FIG. 9 illustrates an OLED touch display panel of on-cell type according to an eighth embodiment of the disclosure. FIG. 10 illustrates a section view of the OLED touch display panel shown in FIG. 9 along the line BB'. The touch display panel according to the embodiment includes a touch electrode, and the touch electrode may have a same structure as the common electrode according to any of the above first to third embodiments.

As shown in FIG. 9, the OLED touch display panel includes a display substrate, a display pixel, a glass cover and a touch electrode.

The touch electrode is provided above the glass cover 9. The touch electrode includes an electrode unit 1, a touch TFT 2 electrically connected to the electrode unit 1, and a first signal line 3 and a second signal line 4 which are electrically connected to the touch TFT 2. FIG. 9 illustrates merely one electrode unit 1 and one touch TFT2 of FIGS. 1-3. It should be noted that more electrode units 1 and touch TFTs 2 can be provided and arranged in a same way as shown in FIGS. 1-3.

The display pixel is arranged between the display substrate 8 and the glass cover 9. The display pixel includes pixel units 7 defined by data lines d1, d2, d3 and gate lines g1 and g1. Each pixel unit 7 corresponds and connects to a display TFT 5. FIG. 9 illustrates merely four pixel units 7 and display TFTs 5. It should be noted that more pixel units and display TFTs may be provided to correspond to one electrode unit 1.

The electrode unit 1 may be formed using transparent indium tin oxides (ITO) in the embodiment, and in this case, the light emitted from the pixel units 7 can pass through the electrode unit 1. Therefore, the electrode unit 1 may be a planar electrode.

As shown in FIG. 10, the display TFTs 5 corresponding to the pixel units 7 are formed on the display substrate 8. Each display TFT 5 includes a gate electrode 51, a first electrode 52 and a second electrode 53.

Pixel units 7 are formed above the display TFTs 5. Each pixel unit 7 includes an anode 71, a cathode 72 and an organic light-emitting layer 73 between the anode 71 and the cathode 72. The anode 71 of the pixel unit 7 may be electrically connected to the first electrode 52 or the second electrode 53 of the display TFT 5 corresponding to the pixel unit 7.

The glass cover 9 is arranged above the pixel unit 7.

The electrode unit 1 and the touch TFT 2 corresponding to the electrode unit 1 are formed on the glass cover 9. As shown in FIG. 10, a gate electrode 21, a first electrode 22 and a second electrode 23 of the touch TFT 2 are formed on the glass cover 9. The gate electrode 21 of the touch TFT 2 may be electrically connected to the first signal line 3 (not shown). The first signal line 3 may be in a same layer as the gate electrode 21. Alternatively, the first signal line 3 may be in a different layer from the gate electrode 21, and in this case the first signal line 3 is electrically connected to the gate electrode 21 through vias.

The first electrode 22 of the touch TFT 2 may be electrically connected to the second signal line 4 (not shown). The second signal line 4 may be in a same layer as the first electrode 22. Alternatively, the second signal line 4 may be in a different layer from the first electrode 22, and in this case the second signal line 4 is electrically connected to the first electrode 22 through vias.

The first electrode 22 of the touch TFT 2 may be a source electrode and the second electrode 23 of the touch TFT 2 may be a drain electrode. Alternatively, the first electrode 22 of the touch TFT 2 may be a drain electrode and the second electrode 23 of the touch TFT 2 may be a source electrode.

The electrode unit 1 is formed on the touch TFT 2, and the electrode unit 1 is electrically connected to the second electrode 23 of the touch TFT 2 through vias. The electrode unit 1 is formed by using an individual layer above the touch TFT 2 as shown in FIG. 10. It should be noted that the electrode unit 1 may be formed in a same layer as the first electrode 22 or the second electrode 23, or may be formed by using other layer, as long as the electrode unit 1 is electrically connected to the first electrode or second electrode of the touch TFT 2.

The above parts are described herein in a progressive manner, with the emphasis of each part on the difference from the other parts. For the same or similar portions between the parts, one part can be understood with reference to the other parts.

With the above descriptions of the disclosed embodiments, the skilled in the art may practice or use the present disclosure. Various modifications to the embodiments are apparent for the skilled in the art. The general principle suggested herein can be implemented in other embodiments without departing from the spirit or scope of the disclosure. Therefore, the present disclosure should not be limited to the embodiments disclosed herein, but has the widest scope that is in conformity with the principle and the novel features disclosed herein.

What is claimed is:

1. An organic light emitting diode (OLED) touch display panel, comprising:
   a display substrate;
   a touch electrode arranged on the display substrate, wherein the touch electrode comprises a plurality of touch electrode units arranged in rows and columns;
   a plurality of touch switch elements, wherein the plurality of touch switch elements each is electrically connected in a one-to-one relationship to one of the plurality of touch electrode units;
   a plurality of first signal lines each electrically connecting to at least two touch switch elements of the plurality of touch switch elements, wherein the at least two touch switch elements are located in different columns, wherein the plurality of first signal lines are configured to turn on or turn off the plurality of touch switch elements electrically connecting to said first signal lines, and wherein the at least two touch switch elements electrically connected with a first signal line of the plurality of first signal lines are not located in a same row;
   a plurality of second signal lines each electrically connecting to at least two touch switch elements of the plurality of touch switch elements, wherein the at least two touch switch elements connected to the second signal line are located in different rows, and wherein the plurality of second signal lines each is configured to provide a driving signal to one of the plurality of touch electrode units electrically connecting to said turned-on touch switch element;
   a display pixel grid arranged on the touch electrode, wherein the display pixel grid comprises a plurality of pixel unit groups each associated with one of the plurality of touch electrode units; and
   a glass cover arranged on the display pixel grid;
   wherein the plurality of touch electrode units each has a plurality of meshes, and wherein the plurality of meshes opposite to a pixel unit in one pixel unit group associated with said touch electrode unit in a vertical direction, respectively.

2. The OLED touch display panel according to claim 1, wherein the plurality of touch switch elements are thin-film transistors each comprising a first electrode, a second electrode and a gate electrode.

3. The OLED touch display panel according to claim 2, wherein the plurality of touch electrode units is arranged in N rows and M columns, and wherein the plurality of first signal lines each is electrically connected to gate electrodes of the thin-film transistors in M columns.

4. The OLED touch display panel according to claim 3, wherein the plurality of second signal lines each is electrically connected to the second electrodes of the thin-film transistors in N rows.

5. The OLED touch display panel according to claim 4, wherein the plurality of second signal lines each is electrically connected to the second electrodes of thin-film transistors in N rows of the same column.

6. The OLED touch display panel according to claim 2, wherein the plurality of touch electrode units each is electrically connected to the first electrode or the second electrode of the thin-film transistor.

7. The OLED touch display panel according to claim 2, further comprising:
   a plurality of display switch elements, wherein the plurality of display switch elements each is electrically connected an associated one of the plurality of pixel units respectively, wherein the display switch elements are thin-film transistors comprising a first electrode, a second electrode and a gate electrode, and
   wherein the gate electrodes, the first electrodes and the second electrodes of the plurality of touch switch elements are formed on same layers as the gate electrodes, the first electrodes and the second electrodes of the display switch elements, respectively.

8. The OLED touch display panel according to claim 7, wherein each of the gate electrodes of the plurality of touch switch elements is formed on a same layer as the associated touch electrode unit.

9. The OLED touch display panel according to claim 1, wherein the at least two touch switch elements electrically connected with a second signal line of the plurality of second signal lines are not located in a same column.

10. An organic light emitting diode (OLED) touch display panel, comprising:
    a display substrate;
    a display pixel grid arranged on the display substrate, wherein the display pixel grid comprises a plurality of pixel unit groups;
    a glass cover arranged on the display pixel grid;
    a touch electrode arranged on the glass cover, wherein the touch electrode comprises a plurality of touch electrode units arranged in rows and columns, wherein each touch electrode unit corresponds to one pixel unit group;
    a plurality of touch switch elements, wherein the plurality of touch switch elements each is electrically connected in a one-to-one relationship to one of the plurality of touch electrode units;
    a plurality of first signal lines, each electrically connecting to at least two touch switch elements of the plurality of touch switch elements, wherein the at least two touch switch elements are located in different columns, wherein the plurality of first signal lines are configured to turn on or turn off the touch switch elements electrically connecting to said first signal lines, and wherein the at least two touch switch elements electrically connected with a first signal line of the plurality of first signal lines are not located in a same row; and
    a plurality of second signal lines, wherein each second signal line is electrically connected to at least two touch switch elements of the plurality of touch switch elements, wherein the at least two touch switch elements connected to the second signal line are located in different rows, and wherein the plurality of second signal lines each is configured to provide a driving signal to said touch electrode unit electrically connecting to the turned-on touch switch element,
    wherein each of the plurality of touch electrode units is a planar electrode.

11. The OLED touch display panel according to claim 10, wherein the touch switch elements are thin-film transistors each comprising a first electrode, a second electrode and a gate electrode.

12. The OLED touch display panel according to claim 11, wherein the plurality of touch electrode units are arranged in N rows and M columns; and
    wherein the plurality of first signal lines each is electrically connected to the gate electrodes of thin-film transistors in M columns.

13. The OLED touch display panel according to claim 12, wherein the plurality of second signal lines each is electrically connected to the second electrodes of thin-film transistors in N rows.

14. The OLED touch display panel according to claim 13, wherein the plurality of second signal lines each is electrically connected to the second electrodes of thin-film transistors in N rows of the same column.

15. The OLED touch display panel according to claim 11, wherein the plurality of touch electrode units each is electrically connected to the first electrode or the second electrode of the thin-film transistor.

16. The OLED touch display panel according to claim 10, wherein the at least two touch switch elements electrically connected with a second signal line of the plurality of second signal lines are not located in a same column.

* * * * *